(12) United States Patent
Yamashita et al.

(10) Patent No.: US 8,764,431 B2
(45) Date of Patent: Jul. 1, 2014

(54) METHOD AND APPARATUS FOR TRANSCRIPTING FINE PATTERNS

(75) Inventors: Naoaki Yamashita, Kamisato (JP); Toshimitsu Shiraishi, Kamisato (JP); Koji Tsushima, Kamisato (JP); Masashi Aoki, Kamisato (JP)

(73) Assignee: Hitachi High-Technologies Corporation, Tokyo (JP)

( * ) Notice: Subject to any disclaimer, the term of this patent is extended or adjusted under 35 U.S.C. 154(b) by 623 days.

(21) Appl. No.: 13/025,694

(22) Filed: Feb. 11, 2011

(65) Prior Publication Data
US 2011/0217479 A1 Sep. 8, 2011

(30) Foreign Application Priority Data

Mar. 8, 2010 (JP) ................................. 2010-050631
Nov. 25, 2010 (JP) ................................. 2010-262320

(51) Int. Cl.
*A01J 21/00* (2006.01)

(52) U.S. Cl.
USPC ..... 425/385; 425/112; 425/174.4; 425/405.1; 425/436 R; 425/443; 264/293

(58) Field of Classification Search
USPC ....... 425/112, 174.4, 405.1, 436 R, 443, 385; 264/293
See application file for complete search history.

(56) References Cited

U.S. PATENT DOCUMENTS

| 7,754,131 | B2 * | 7/2010 | Olsson et al. ................. 264/293 |
| 8,186,992 | B2 * | 5/2012 | Washiya et al. ............... 425/385 |
| 2005/0017383 | A1 * | 1/2005 | Shimizu et al. .............. 264/1.24 |
| 2008/0122144 | A1 * | 5/2008 | Zhang et al. .................. 264/571 |
| 2008/0229948 | A1 * | 9/2008 | Washiya et al. ............... 101/324 |
| 2009/0061035 | A1 * | 3/2009 | Cho et al. .................. 425/174.4 |

FOREIGN PATENT DOCUMENTS

| JP | 2004-303385 A | 10/2004 |
| JP | 2006-018975 A | 1/2006 |
| JP | 2009-220559 A | 10/2009 |

* cited by examiner

*Primary Examiner* — Joseph S Del Sole
*Assistant Examiner* — David N Brown, II
(74) *Attorney, Agent, or Firm* — Mattingly & Malur, PC

(57) ABSTRACT

In a method for transcripting fine patterns and an apparatus for transcripting fine patterns, the ingress of bubbles is prevented and patterns are transcripted with a high throughput by a relatively compact apparatus. For this purpose, a back surface of a stamper is vacuum sucked and the stamper is brought into close contact with a target of transcription with its surfaces coated with resist and pressure is applied thereto. At this time, the stamper is deformed into a spherical shape or bent to expand the close contact face from a central area to a peripheral area to prevent the ingress of air bubbles into between the target of transcription and the stamper.

8 Claims, 9 Drawing Sheets

METHOD AND APPARATUS FOR TRANSCRIPTING FINE PATTERNS

BACKGROUND

The present invention relates to a method for transcripting a fine pattern formed on a stamper to the surface of a target of transcription and an apparatus therefor.

In recent years, semiconductor integrated circuits have been increasingly microminiaturized and their designs have been made more and more dense. As a pattern transcription technology for implementing fine patterning therefor, accuracy of photolithography equipment has been increased. The processing methods have been brought close to the wavelength of light sources for light exposure and lithography technologies are approaching their limits. To cope with this, electron beam lithography systems, which are a type of charged particle beam system, have taken over lithography technologies to accelerate further microminiaturization and accuracy enhancement.

In pattern formation using electron beams, a mask pattern is lithographed unlike one-shot exposure methods in pattern formation using such a light source as i-ray and excimer laser. Therefore, exposure (lithography) takes more time as the number of patterns to be lithographed is increased and it is believed that necessity for much time in pattern formation is a disadvantage of electron beam lithography. For this reason, as the scale of integration is dramatically increased to 256 mega to 1 giga to 4 giga, the pattern formation time is accordingly dramatically lengthened. There is apprehension that throughputs are significantly degraded. Consequently, to accelerate electron beam lithography systems, cell projection lithography is being developed. In the cell projection lithography, masks in various shapes are combined and electron beams are applied to them in a lump to form an electron beam in a complicated shape. As a result, while the microminiaturization of patterns has been facilitated, a disadvantage of increased equipment cost has been brought about. For example, it is inevitable to increase the size of each electron beam lithography system and a mechanism for accurately controlling mask positions is required.

Meanwhile, there are imprint technologies for forming fine patterns at low cast. In these technologies, a stamper having recesses and projections patterned similarly to a pattern desired to be formed over a substrate is pressed against a resist film layer formed over the surface of the substrate as the target of transcription. Thereafter, the stamper is broken away and a desired pattern is thereby transcripted onto the resist. A silicon wafer is used as the stamper and a fine pattern not more than 25 nanometers can be formed by transcription. With respect to the imprint technology, consideration has been given to application thereof to the formation of recording bits in large-capacity recording media, the formation of semiconductor integrated circuit patterns, and the like.

To accurately transcript a fine pattern onto a large-capacity recording medium substrate or a semiconductor integrated circuit substrate by the imprint technology, it is necessary to take the following measure: a stamper is pressed so that pressure is evenly applied to a pattern transcription area over the surface of a substrate as the target of transcription which is slightly undulated.

Japanese Unexamined Patent Publication No. 2004-303385 describes an invention relating to the prevention of the ingress of air bubbles due to superficial slight undulation by taking the following measure in a manufacturing method for optical disks: transcription is carried out while a warp is produced in the master.

US Patent Publication No. 2008/0229948A1 and Japanese Unexamined Patent Publication No. 2006-018975 describe inventions in which the ingress of air bubbles due to superficial slight undulation is prevented by taking the following measure: transcription is carried out while pressure is applied by a fluid to bend a stamper.

Japanese Unexamined Patent Publication No. 2009-220559 describes an invention relating to a technology for transcripting fine patterns by nanoimprinting. In this technology, the ingress of air bubbles due to superficial slight undulation is prevented to uniformly transcript a pattern by carrying out the transcription in vacuum or liquefied gas.

However, the transcription method described in Japanese Unexamined Patent Publication No. 2004-303385 uses mechanical fixture and does not take into account the influence of dusting at a slide part between the fixture and a stamper. It does not take the following into account, either: it is difficult to continuously deform the master by a small amount and this causes unevenness in the wetting and spreading of resist.

According to the transcription methods described in the US Patent Publication No. 2008/0229948A1 and Japanese Unexamined Patent Publication No. 2006-018975, the formation of air bubbles due to superficial slight undulation can be suppressed by using a fluid to make a stamper surface spherical. However, these methods involve the problems of degradation in the cleanliness of an environment by dusting due to leakage of a fluid, the complication of a structure, and the like.

According to the method described in Japanese Unexamined Patent Publication No. 2009-220559, the ingress of air bubbles due to superficial slight undulation can be prevented by bringing the atmosphere under vacuum. However, this method involves the following problems: the entire system must be placed in a vacuum chamber and this increases the size of equipment and loading to and unloading from the vacuum chamber take time and this degrades the overall throughput.

SUMMARY

It is an object of the invention to provide a method for transcripting fine patterns wherein it is possible to solve the above-mentioned problems associated with the conventional technologies and prevent the ingress of bubbles and transcript patterns with a high throughput by a relatively compact apparatus and the apparatus therefor.

To achieve the above object, the following measure is taken in this invention with respect to a method for transcripting fine patterns: a stamper is brought into close contact with a target of transcription with its surface coated with resist by vacuum sucking the back surface of the stamper and pressure is applied to the target of transcription; at this time, the stamper is deformed or bent into a spherical shape and the close contact face is expanded from the central area to the peripheral area. The ingress of air bubbles into between the target of transcription and the stamper is thereby prevented.

More specific description will be given. To achieve the above object, in this invention, two stampers that make a pair with a pattern formed therein is pressed against both sides of a substrate with resist applied thereto; and the patterns formed in the two stampers are transcripted to the resist applied to both sides of the substrate. Each of the stampers is deformed into a convex shape and the two stampers deformed into a convex shape are moved in a direction perpendicular to both sides of the substrate with resist applied thereto. The two stampers are gradually pressed against both sides of the substrate from the central area to the peripheral area of the convex shape. With the two stampers pressed by a predetermined amount, the deformation of the stampers into a convex shape is released and the stampers are pressed against both sides of the substrate. With the stampers, whose deformation into a convex shape has been released, pressed against both sides of the substrate, UV light is applied to the resist applied to both sides of the substrate to expose the resist on both sides of the substrate to the light. After the resist exposed to the light is cured, the paired stampers are sequentially broken away from the substrate.

To achieve the above object, in this invention, fine patterns are transcripted as described below. Resist is applied to both sides of a substrate. Two stampers that make a pair with fine patterns formed therein are pressed against both sides of the substrate with the resist applied thereto and the resist is exposed to light. The patterns in the two stampers are thereby transcripted to the resist applied to both sides of the substrate. After the resist with the patterns transcripted thereto is cured, the paired stampers pressed against both sides of the substrate are sequentially broken away from the substrate. At a step of transcripting the patterns in the two stampers to the resist applied to both sides of the substrate in this method, the following procedure is used: the two stampers are deformed into a convex shape and in this state, the stampers are pressed against the substrate; with the two stampers pressed against the substrate, the deformation of the stampers into a convex shape is released; and with the stampers, whose deformation into a convex shape has been released, pressed against both side of the substrate, UV light is applied and the resist applied to both sides of the substrate is exposed to the light. The patterns formed in the two stampers are thereby transcripted to the resist applied to both sides of the substrate.

To achieve the above object, in this invention, an apparatus for transcripting fine patterns includes: a resist application unit applying resist to both sides of a substrate; a transcription exposure unit pressing two stampers that make a pair with fine patterns formed therein against both sides of the substrate with the resist applied thereto by this resist application unit and exposing both sides to light and thereby transcripts the patterns in the two stampers to the resist applied to both sides of the substrate; a substrate unloading unit breaking the substrate away from one stamper of the paired stampers pressed against both sides of the substrate with the patterns transcripted thereto and unloading this substrate from the transcription exposure unit together with the other stamper of the paired stampers; a breakaway unit receiving the substrate unloaded from the transcription exposure unit by the substrate unloading unit and breaking this substrate away from the other stamper. In this apparatus, the transcription exposure unit includes: two stamper deforming means that make a pair respectively deforming two stampers that make a pair into a convex shape and release the deformation into a convex shape; two stamper driving means that make a pair respectively advancing or retreating the two stampers in a direction perpendicular to both sides of the substrate with the resist applied thereto; and exposure means applying UV light to both sides of the substrate with the resist applied thereto with the two stampers pressed against both sides by the two stamper driving means and exposes the resist on both sides to the light.

According to the invention, a method for transcripting fine patterns wherein it is possible to prevent the ingress of air bubbles due to superficial slight undulation and transcript patterns with a high throughput by a relatively compact apparatus and an apparatus therefor are provided.

These features and advantages of the invention will be apparent from the following more particular description of preferred embodiments of the invention, as illustrated in the accompanying drawings.

DESCRIPTION OF THE PREFERRED EMBODIMENTS

Description will be given of modes for implementing a fine pattern transcription apparatus of the invention.

First Embodiment

Figure 1:
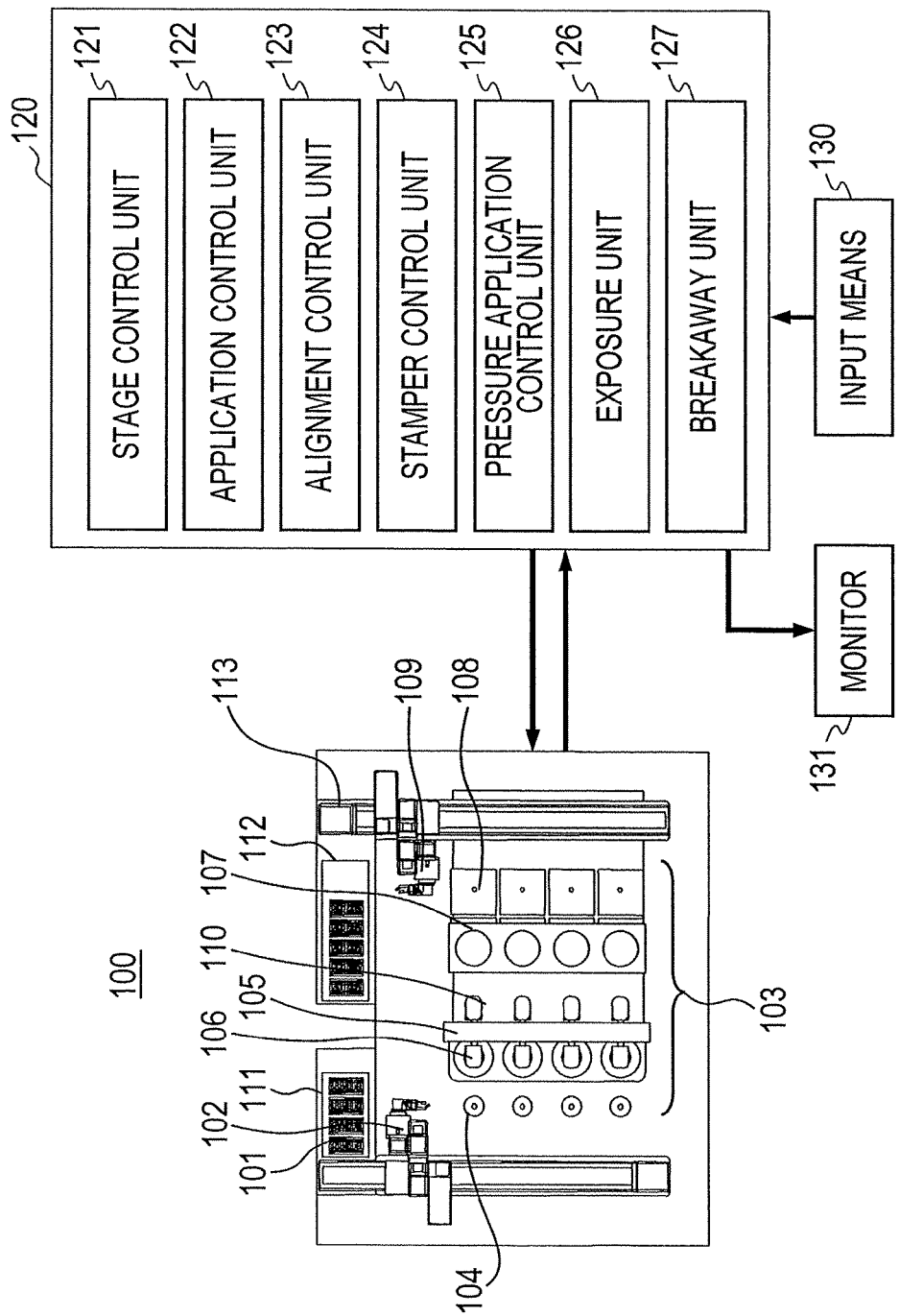
FIG. 1 is a block diagram illustrating the overall configuration of a fine pattern transcription apparatus.

FIG. 1 illustrates the configuration of a fine pattern transcription apparatus 100 in the first embodiment. The apparatus mainly includes: a disk supply material handler 102 that moves a disk substrate 101 as the target of transcription; a transcription part 103 that transcripts a concavo-convex pattern to the surface of the disk substrate 101; a disk ejection material handler 109 that, after the completion of transcription, moves the disk substrate 101; a control part 120 that controls the entire apparatus; an input device 130; and a monitor 131.

Figure 2:
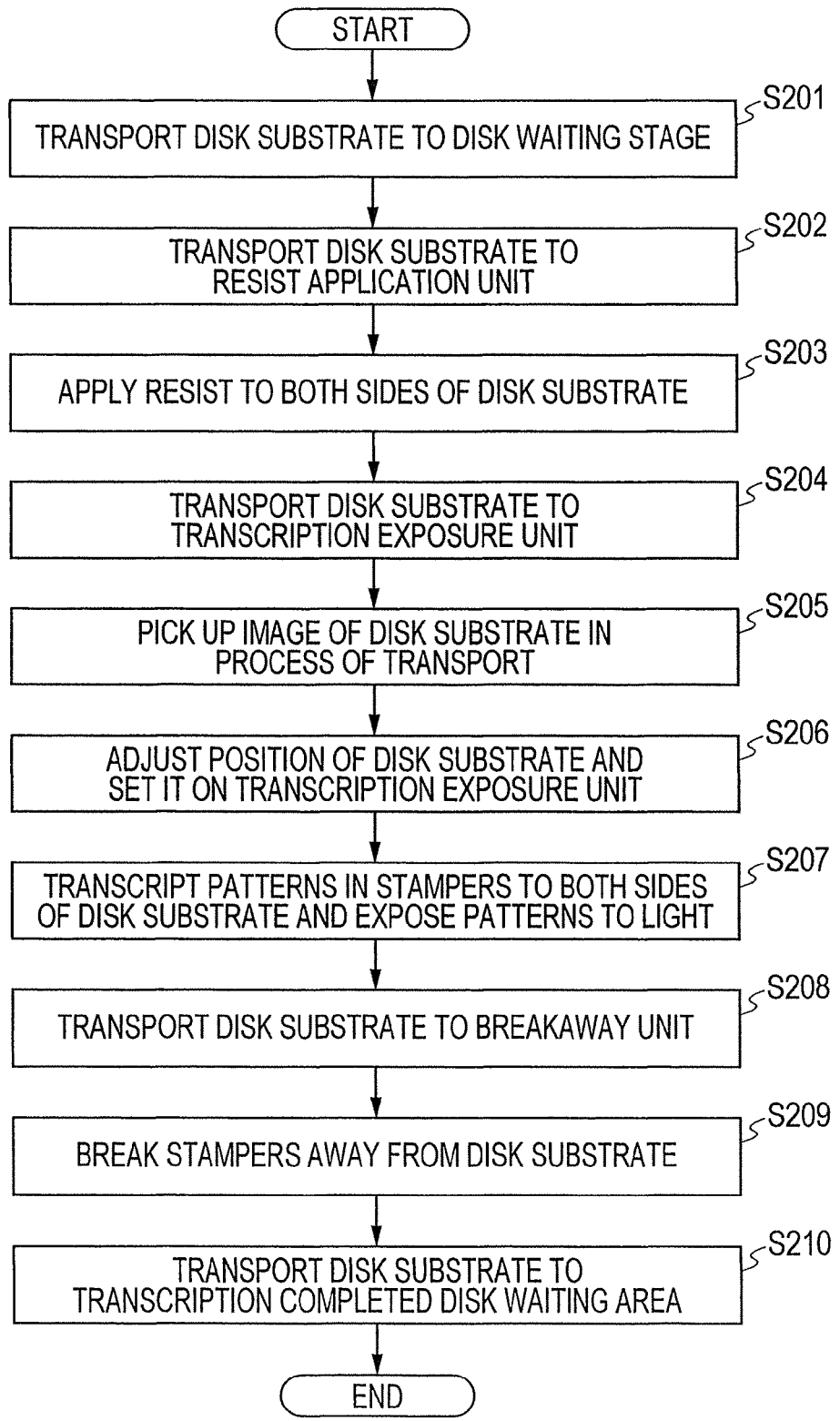
FIG. 2 is a flowchart illustrating the flow of processing in the whole of a fine pattern transcription apparatus in a first embodiment.

Description will be given of the flow of processing of forming a fine pattern on both sides of a disk substrate 101 by this fine pattern transcription apparatus 100 with reference to FIG. 2.

First, to transcript a concavo-convex pattern to its surface, a pre-transcription disk substrate 101 is transferred from a pre-transcription disk waiting area 111 to the disk waiting stage 104 of the transcription part 103 by the disk supply material handler 102 (S201). The transcription part 103 includes: the disk waiting stage 104; a transcription material handling unit 105; a resist application unit 106; an exposure unit 107; a breakaway unit 108; and an image pickup unit 110 that picks up an image of a disk substrate 101 in the process of transport from the resist application unit 106 to the exposure unit 107. One or more transcription parts are installed depending on the preset production capacity of the apparatus.

A disk substrate 101 transferred to the disk waiting stage 104 is moved to the resist application unit 106 by the transcription material handling unit 105 (S202) and resist is applied to both sides of the disk substrate 101 (S203). To apply resist, a spin coat method, an ink jet method, or the like is used. After the completion of application, the disk substrate 101 is moved to the exposure unit 107 mounted with stampers and an exposure device (S204).

Figure 3A:
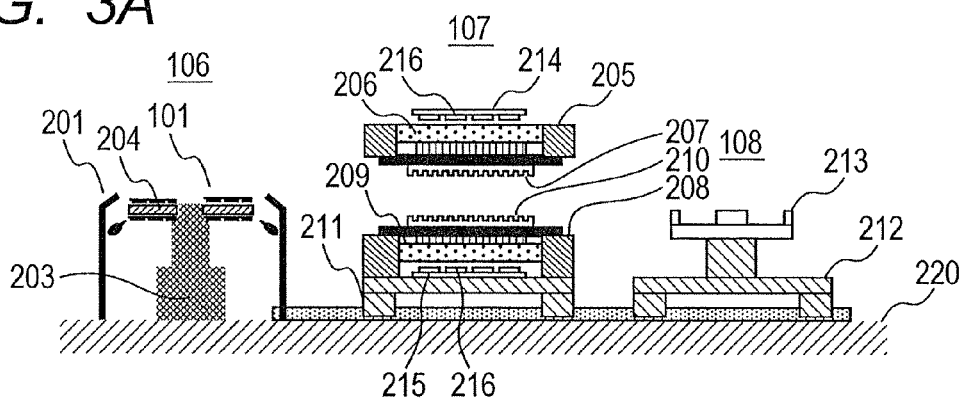
FIG. 3A is a block diagram of a transcription part illustrating how resist is applied to a disk substrate in a resist application unit in the first embodiment.
Figure 3B:
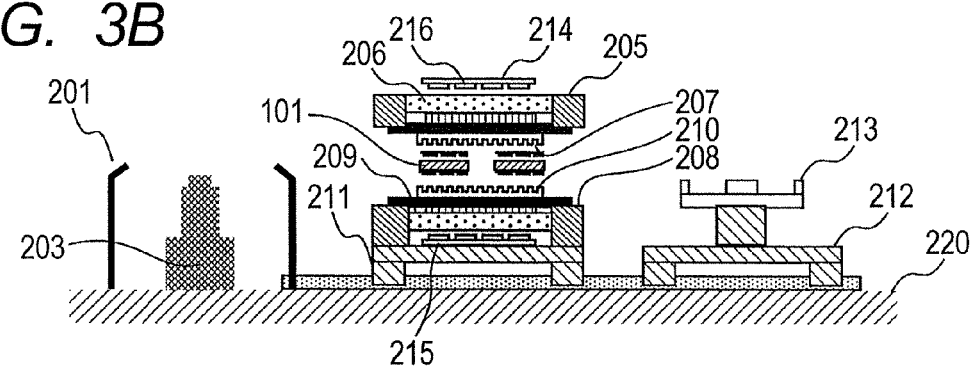
FIG. 3B is a block diagram of the transcription part illustrating how the disk substrate with resist applied thereto is transported to a transcription exposure unit in the first embodiment.

During this movement, an image of the disk substrate 101 is picked up by the image pickup unit 110 (S205) and this image is processed at the control part 120 to acquire positional information on the disk substrate 101. Position coordinates for setting the disk substrate 101 on the pressure application and exposure unit 107 are determined so that the following is implemented: the stampers 207 and 210 (Refer to FIG. 3A) of the exposure unit 107 are brought into contact with the disk substrate 101 in desired positions (S206).

The stampers 207 and 210 have fine patterns formed in their surfaces. The stampers are brought into close contact with the disk substrate 101 with resist applied to both sides thereof in the desired positions. In this state, exposure light is applied to the resist through the stampers 207 and 210 and the resist is exposed to the light (S207). As the result of this exposure, the above-mentioned resist is cured and the fine patterns in the surfaces of the stampers 207 and 210 are transcripted to the resist applied to both sides of the disk substrate 101.

Subsequently, the disk substrate 101 in close contact with the upper stamper 207 is separated from the lower stamper 210. The disk substrate 101 in close contact with the upper stamper 207 is transferred together with the upper stamper 207 to the breakaway unit 108 by the transcription material handling unit 105 (S208). At the breakaway unit 108, the upper stamper 207 and the disk substrate 101 are separated from each other (S209). The disk substrate 101 with fine patterns formed in the resist layers over the surfaces thereof, separated from the upper stamper 207, is ejected from the transcription part 103 and placed in a transcription completed disk waiting area 113 by the disk ejection material handler 109 (S210). The stampers 207 and 210 attached to the exposure unit 107 are replaced with stampers stored on a stamper waiting stage 112 by the disk ejection material handler 109 as appropriate.

The control part 120 includes: a stage control unit 121 controlling the supply material handler 102 and the disk ejection material handler 109 that move a disk substrate 101 between units; an application control unit 122 having controlling means for controlling a valve, a motor, and the like of a resist supply unit, not shown, which supplies resist applied to both sides of the disk substrate 101 and controlling resist film thickness and the ratio of components thereof; an alignment control unit 123 having image processing means for analyzing an image of the disk substrate 101 in the process of transport by the transcription material handling unit 105, picked up with the image pickup unit 110 and computing the position of the disk substrate 101 and the positions of the patterns in the stampers 207 and 210; a stamper control unit 124 that counts the number of work pieces processed with the stampers 207 and 210 or controls the replacement of stampers; a pressure application control unit 125 having signal processing means for detecting the state of close contact between the disk substrate 101 and the stampers 207 and 210 and controlling the pressure applying force of the exposure unit 107; an exposure control unit 126 that controls exposure time and exposure output; and a breakaway control unit 127 that controls separation of a disk substrate from stampers or movement from the transcript unit.

The control part 120 is coupled with the input means 130 and the monitor 131. The input means 130 is used to input manufacturing conditions such as the number of disks to be subjected to transcription and items required for manufacture. The monitor 131 is capable of displaying the status of the apparatus, conditions, the cumulative number of work pieces processed with an identical stamper, and a support screen for input.

As mentioned above, the transcription part 103 brings stampers 207 and 210 with fine patterns formed in the surfaces thereof into close contact with a disk substrate 101 with resist applied thereto. The fine patterns in the surfaces of the stampers 207 and 210 are thereby transcripted to the resist over the disk substrate 101. More detailed description will be given to this operation with reference to FIGS. 3A to 3D.

As described with reference to FIG. 1, the transcription part 103 mainly includes the resist application unit 106, exposure unit 107, and breakaway unit 108 and is installed over a common base plate 220.

First, a disk substrate 101 is transferred from the disk waiting stage 104 to the spin coating spindle 203 in the resist application unit 106 and set there by the transcription material handling unit 105 controlled by the stage control unit 121 of the control part 120. The spindle 203 is encircled with a protection barrier 201 for preventing resist from flying in all directions. Thereafter, the spindle 203 is rotated under the control of the application control unit 122 of the control part 120, and resist 204 is applied from a dispenser, not shown, to both sides of the disk substrate 101. A thin resist film is thereby formed over both sides of the disk substrate 101. (Refer to FIG. 3A.)

The disk substrate 101 with the thin resist films formed thereover is moved to the exposure unit 107 by the transcription material handling unit 105. The exposure unit 107 includes: the upper pressure application and close contact unit 205; upper backup glass 206; an upper UV exposure unit 214; an upper stamper 207 attached to the upper pressure application and close contact unit 205; a lower pressure application and close contact unit 208; lower backup glass 209; a lower UV exposure unit 215; and a lower stamper 210 attached to the lower pressure application and close contact unit 208. The exposure unit 107 is installed over a base 211. The disk substrate 101 with the thin resist films formed thereover is guided into between the upper stamper 207 and the lower stamper 210. (Refer to FIG. 3B.)

Thereafter, the upper pressure application and close contact unit 205 is driven by driving means (Refer to FIG. 5A) and moved down. As a result, the disk substrate 101 sandwiched between the upper stamper 207 and the lower stamper 210 is brought into close contact with the upper stamper 207 and the lower stamper 210. In the surfaces of the upper stamper 207 and the lower stamper 210, there are formed fine patterns. With the upper stamper 207 and the lower stamper 210 in close contact with the disk substrate 101 with resist applied to both sides thereof, UV (Ultra Violet) light is projected from the upper UV exposure unit 214 and the lower UV exposure unit 215. The light is transmitted through the upper stamper 207 and the lower stamper 210 and applied to the resist and the resist is thereby exposed to the light. As the result of this exposure, the above-mentioned resist is cured and the fine patterns in the stamper surfaces are transcripted to both sides of the disk substrate. This UV light is projected using multiple LEDs (Light Emitting Diodes) 216 as light sources. (Refer to FIG. 3C.)

The disk substrate 101 to which the fine patterns formed in the upper stamper 207 and the lower stamper 210 are transcripted is moved to the breakaway unit 108 by the transcription material handling unit 105. At this time, as described later, the disk substrate is broken away from the lower stamper 210 and is brought into close contact with the upper stamper 207. After the completion of movement to the breakaway unit 108, the disk substrate 101 that underwent transcription is fixed using a disk fixture 213 installed over a base 212. Thereafter, the upper pressure application and close contact unit 205 is moved up by the driving means and the upper stamper 207 and the disk substrate 101 with the fine patterns transcripted thereto are separated from each other. (Refer to FIG. 3D.)

The disk substrate 101 separated from the upper stamper 207 is taken out of the breakaway unit 108 and placed in the transcription completed disk waiting area 113 by the transcription material handling unit 105.

Figure 3C:
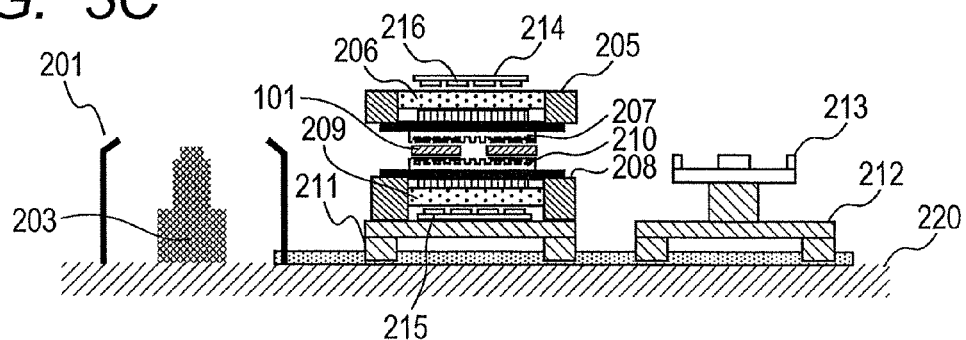
FIG. 3C is a block diagram of the transcription part illustrating how patterns in stampers are transcripted to the disk substrate with resist applied thereto and are exposed to light at the transcription exposure unit in the first embodiment.

Detailed description will be given to Step S207 in FIG. 2, that is, the step of transcripting patterns in stampers to both sides of a disk substrate 101 and exposing them to light, in other words, the step shown in FIG. 3C. The description will be given with reference to the flowchart in FIG. 4, FIGS. 5A to 5E, and FIG. 6. The mechanism of the upper pressure application and close contact unit 205 and the mechanism of the lower pressure application and close contact unit 208 are basically identical with each other. Description will be given based on the upper pressure application and close contact unit 205.

The upper pressure application and close contact unit 205 includes: the upper stamper 207, a stamper holding part 303 formed of an elastic body; a pressure application base 304; a stamper backup elastic body 305; the upper backup glass 206; and the upper UV exposure unit 214. The surface of the stamper holding part 303 on the upper stamper 207 side and the surface of the stamper backup elastic body 305 on the upper stamper 207 side are identical in height or the stamper backup elastic body 305 is slightly lower. The stamper holding part 303 is formed of a material softer (higher in modulus of elasticity) than the material of the stamper backup elastic body 305.

First, the image of the disk substrate 101 obtained by picking it up with the image pickup unit 110 is processed at the alignment control unit 123 of the control part 120. Based on the positional information on the disk substrate 101 obtained as the result of the processing, the control part 120 controls the transcription material handling unit 105. The disk substrate 101 is thereby set on the exposure unit 107 so that a predetermined positional relation is obtained between the disk substrate 101 with resist applied thereto and the upper stamper 207 (S401).

Figure 5A:
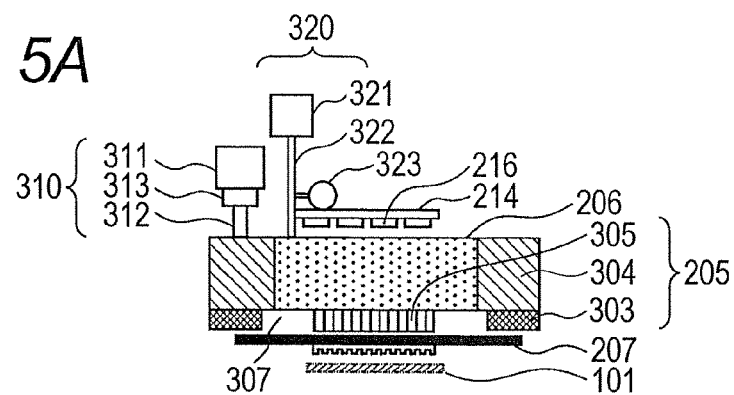
FIG. 5A is a sectional view of an upper pressure application and close contact unit illustrating how a disk substrate with resist applied thereto is set in a transcription exposure unit in the first embodiment.

The space on the back side (the surface on the side where a fine pattern is not formed) of the upper stamper 207 is evacuated and brought under slight negative pressure (−5 to −15 kPaG or so) by evacuating means 320. The evacuating means includes an evacuation pump 321 connected through a vacuum pipe 322 and a vacuum gage 323. As a result, the upper stamper 207 is sucked by a differential pressure between the negative pressure and atmospheric pressure and the part of the upper stamper 207 in proximity to its peripheral area is pressed against the stamper holding part 303 and held there (S402) (FIG. 5A).

While the pressure is monitored with the vacuum gage 323, the space 307 on the back side of the upper stamper 207 is evacuated by the evacuating means 320 and its pressure is further reduced. Since the stamper holding part 303 is formed of an elastic body, the following takes place when the pressure in the space 307 on the back side of the upper stamper 207 is reduced: according to the differential pressure between the reduced pressure and atmospheric pressure produced thereby, the stamper holding part 303 is pressed by the peripheral area of the upper stamper 207 and deformed.

Figure 5B:
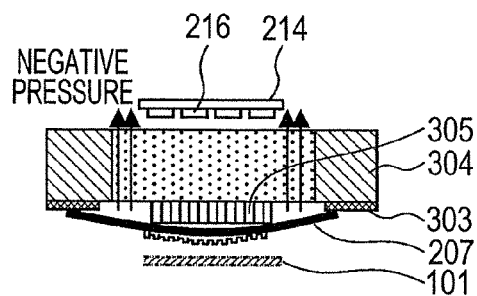
FIG. 5B is a sectional view of the upper pressure application and close contact unit illustrating how the space located on the back side of an upper stamper is evacuated to deform the upper stamper into a convex shape at the transcription exposure unit in which the disk substrate with resist applied thereto is set in the first embodiment.

Meanwhile, the part of the upper stamper 207 in proximity to its central area is brought into contact with the stamper backup elastic body 305. According to the differential pressure between the reduced pressure and atmospheric pressure, the stamper backup elastic body 305 is pressed by the part of the upper stamper 207 in proximity to its central area and deformed. The stamper holding part 303 is formed of a material softer (higher in modulus of elasticity) than the material of the stamper backup elastic body 305 or is mechanically moved with a vacuum maintained. Therefore, the amount of deformation in the stamper holding part 303 in contact with the peripheral area of the disk substrate 101 becomes larger and the upper stamper 207 is deformed into a convex shape toward the disk substrate 101 (S403). The pressure in the space 307 on the back side of the upper stamper 207 is −10 kPa to −90 kPa or so and the optimum value is determined based on the area of the pattern and the material of the stamper. In this embodiment, the stamper is deformed under a pressure of −20 kPa to −60 kPa (FIG. 5B).

Figure 6:
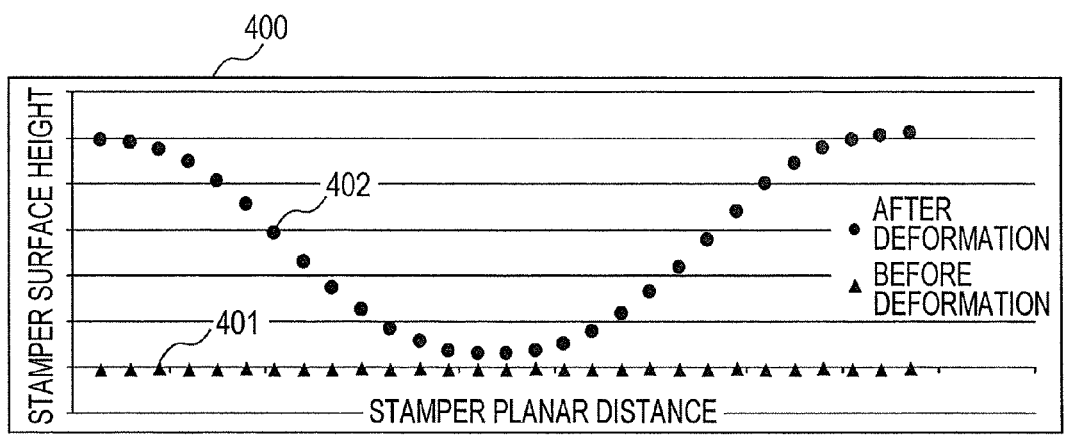
FIG. 6 is a drawing indicating the states of deformation in the surface of a stamper before and after it is deformed into a convex shape in the first embodiment.

FIG. 6 is a graph 400 obtained by plotting the surface height of the upper stamper 207. The curve marked with reference numeral 401 indicates the state before deformation and the curve marked with reference numeral 402 indicates the state after deformation. The above-mentioned stamper 207 in the initial state is in the state indicated by the curve 401 in the graph. When the space 307 on the back side of the upper stamper 207 is evacuated, the part of the upper stamper 207 in proximity to its peripheral area is pressed against the stamper holding part 303. As a result, the part of the upper stamper 207 in proximity to its central area is pressed against the stamper backup elastic body 305 and it is deformed into a convex shape. The upper stamper in this state is indicated by the curve 402.

Subsequently, the upper pressure application and close contact unit 205 is driven by a driving mechanism 310 including a motor 311 coupled through a drive shaft 312 and a torque sensor 313 for monitoring the output of the motor 311. The pressure application base 304 is thereby moved toward the disk substrate 101 to bring the stamper 207 in a convex shape into close contact with the disk substrate 101 (S404). Since the upper stamper 207 is in a convex shape, it is brought into gradual contact with the disk 101 from its central area to its peripheral area. After the contact, the pressure application base 304 is further moved toward the disk 101. As a result, the pressure application base 304 further applies pressure to increase the area of close contact between the stamper 207 in a convex shape and the disk substrate 101. After the output of the motor 311 detected with the torque sensor 313 becomes equal to a predetermined value and the force of pressing the upper stamper 207 against the disk substrate 101 reaches the preset pressure applying force, the following processing is carried out: the output of the motor 311 is stopped to stop the movement of the pressure application base 304 toward the disk 101 by the driving mechanism 310 (S405).

Figure 5C:
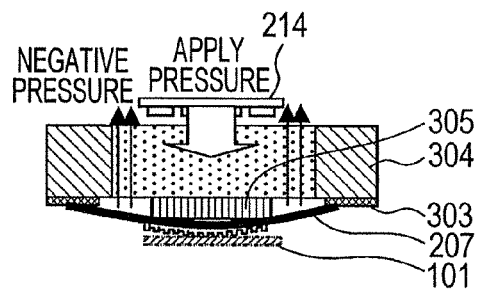
FIG. 5C is a sectional view of the upper pressure application and close contact unit illustrating how the upper stamper deformed into a convex shape is pressed against the disk substrate with resist applied thereto at the transcription exposure unit in the first embodiment.

Subsequently, the evacuation of the space on the back side of the upper stamper 207 by the evacuating means 320 is interrupted (S406). Then the pressure in the space on the back side of the upper stamper 207 is increased to release the deformation of the upper stamper 207 into a convex shape. As a result, the upper stamper 207 is returned to its initial flat state and is brought into completely close contact with the entire surface of the disk substrate 101 (S407). At this time, the pressure in the space 307 on the back side of the upper stamper 207 is set to −20 kPa to 100 kPa to more reliably obtain close contact. The value of the pressure in the space 307 on the back side of the upper stamper 207 differs depending on the shape and material of the upper stamper 207 and the area of the pattern. In this embodiment, close contact is obtained at −20 kPa to 0 kPa. This makes it possible to deform the upper stamper 207 by a very small amount and expanded the close contact face from the central area to the peripheral area. As a result, it is possible to prevent the ingress of air bubbles into between the disk substrate 101 as the target of transcription and the upper stamper 207 (FIG. 5C).

Figure 5D:
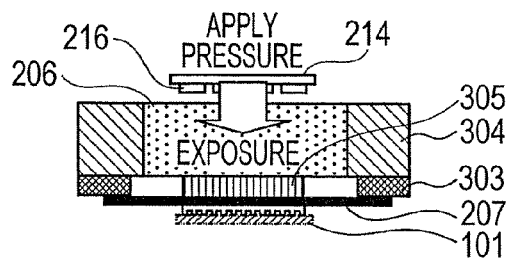
FIG. 5D is a sectional view of the upper pressure application and close contact unit illustrating how the upper stamper whose deformation into a convex shape is released is pressed against the disk substrate with resist applied thereto and the resist is exposed to light at the transcription exposure unit in the first embodiment.

After the close contact is obtained, the upper UV exposure unit 214 is used to apply UV light to the resist applied to the surface of the disk substrate 101 through the upper backup glass 206, stamper backup elastic body 305, and upper stamper 207. The resist is thereby exposed to the light and cured (S408) (FIG. 5D).

Figure 5E:
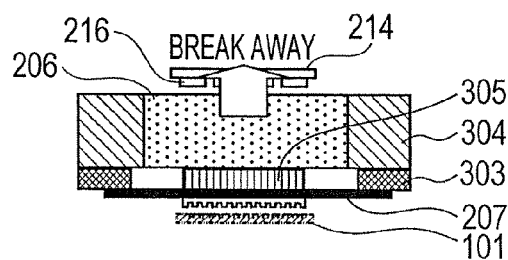
FIG. 5E is a sectional view of the upper pressure application and close contact unit illustrating how a lower stamper is broken away from the substrate with resist exposed to light at the transcription exposure unit in the first embodiment.

After the resist is cured, the lower stamper 210 is kept retained to the side of the lower pressure application and close contact unit 208 by a retaining mechanism, not shown. In this state, the pressure in the space 307 on the back side of the upper stamper 207 is reduced again. With the disk substrate 101 sucked to the upper stamper 207, the upper pressure application and close contact unit 205 is moved up (retreated) by the driving mechanism 310 (S409). As a result, the lower stamper 210 is broken away from the disk substrate 101 (FIG. 5E).

Figure 3D:
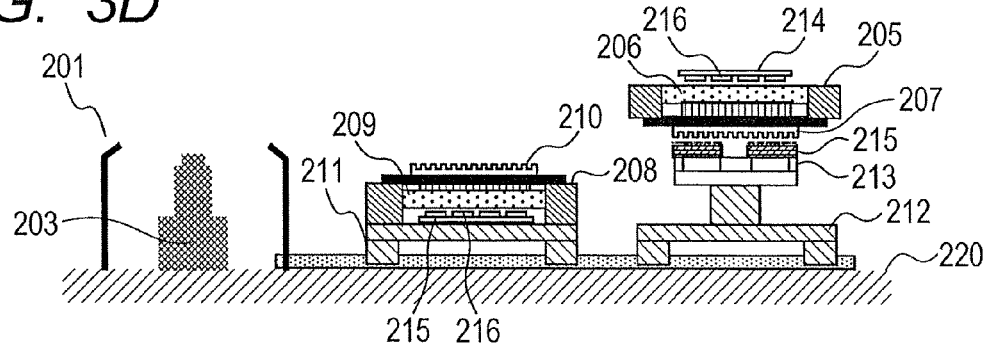
FIG. 3D is a block diagram of the transcription part illustrating how the disk substrate with the patterns transcripted thereto is transported to a breakaway unit in the first embodiment.
Figure 4:
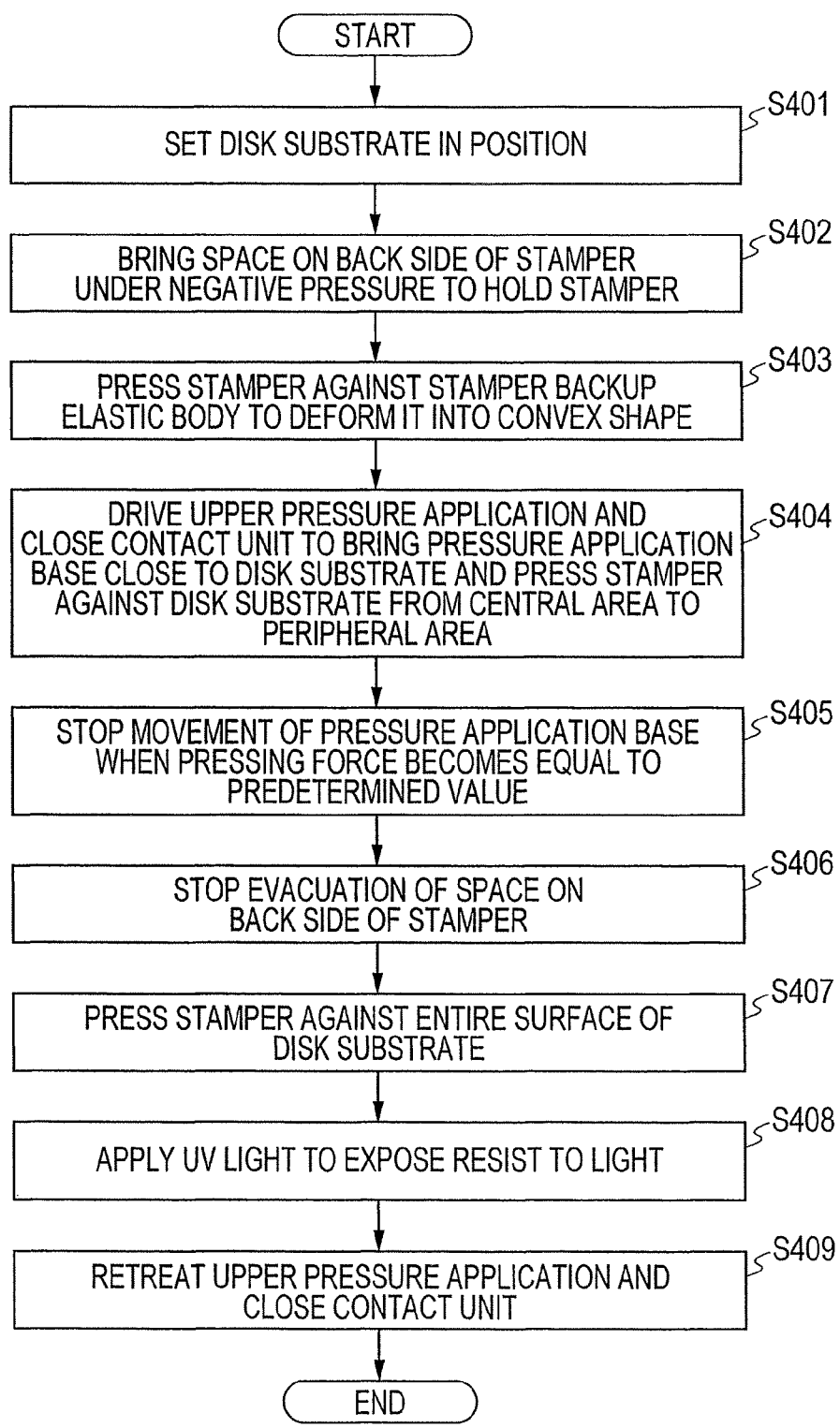
FIG. 4 is a flowchart illustrating the flow of processing in which patterns in stampers are transcripted to a disk substrate with resist applied thereto and are exposed to light at the transcription exposure unit in the first embodiment.

Thereafter, as described with reference to FIG. 2, the disk substrate 101 sucked to the upper stamper 207 is transported to the breakaway unit 108 by a handling unit, not shown, as illustrated in FIG. 3D. At the breakaway unit 108, the disk substrate 101 is held by the disk fixture 213. In this state, the pressure in the space 307 on the back side of the upper stamper 207 is returned to atmospheric pressure and the upper pressure application and close contact unit 205 is held and moved up by the driving mechanism 310. As a result, the disk substrate 101 held on the disk fixture 213 is completely broken away from the upper stamper 207 (S209).

Second Embodiment

The steps in the second embodiment are substantially identical with the steps described in relation to the first embodiment except Step S409 of retreating the upper pressure application and close contact unit and Step S209 of breaking a stamper away from a disk substrate. The configurational elements not covered in the description of the second embodiment are the same as those described in relation to the first embodiment.

More specific description will be given. In the description of the first embodiment, a case where the following measure is taken after the resist is exposed to light at Step S408 has been taken as an example: at Step S409, the upper pressure application and close contact unit 205 is retreated to break the disk substrate 101 away from the lower stamper 210; at this time, the lower stamper 210 is retained to the side of the lower pressure application and close contact unit 208 by a retaining mechanism, not shown; in this state, the pressure in the space 307 on the back side of the upper stamper 207 is reduced to suck the disk substrate 101 to the upper stamper 207 and the upper pressure application and close contact unit 207 is moved up; and the disk substrate 101 is thereby broken away from the lower stamper 210. In the second embodiment, a different method in which a retaining mechanism is not used is adopted. The space on the back side of the lower stamper 210 is evacuated to reduce its pressure by exhausting means to deform the lower stamper 210 into a convex shape. The disk substrate 101 in close contact with the lower stamper 210 is thereby gradually broken away from the peripheral area.

In the description of the first embodiment, the following method has been taken as an example of a method for breaking the disk substrate 101 away from the upper stamper 207 at the breakaway unit 108 at Step S209: with the disk substrate 101 held on the disk fixture 213 of the breakaway unit 108, the pressure in the space 307 on the back side of the upper stamper 207 is returned to atmospheric pressure; and the upper pressure application and close contact unit 205 is moved up to break the disk substrate away from the upper stamper. In the second embodiment, a different method is adopted. In this method, the space 307 on the back side of the upper stamper 207 is evacuated with exhausting means to reduce its pressure and deform the upper stamper 207 into a convex shape. The disk substrate 101 in close contact with the upper stamper 207 is thereby gradually broken away from the peripheral area.

Figure 8A:
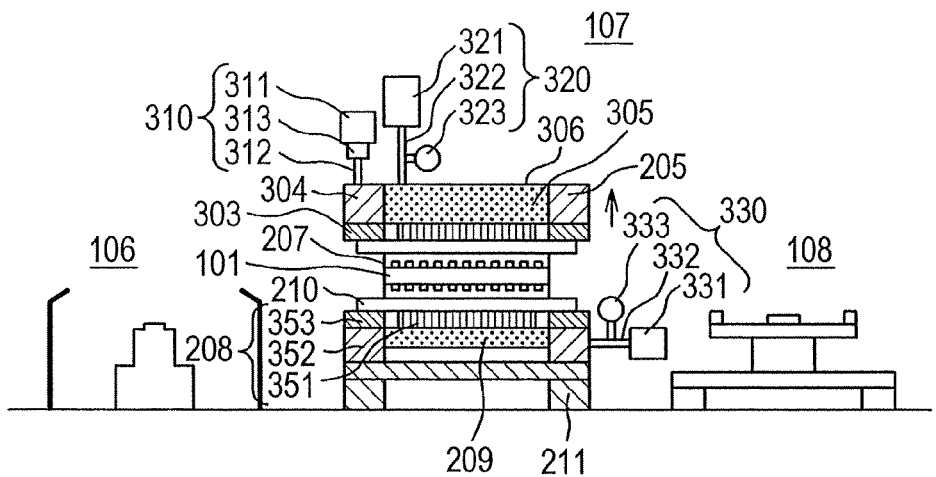
FIG. 8A is a sectional view of the transcription exposure unit of a transcription part illustrating how the disk substrate pressing force of upper and lower stampers is released after exposure in the second embodiment.

With respect to the second embodiment, first, description will be given to a method for, after resist is exposed to light, breaking the disk substrate 101 away from the lower stamper 210 at a step equivalent to Step S409. In this embodiment, as illustrated in FIG. 8A, the space 801 on the back side of the lower stamper 210 is evacuated with evacuating means 330 including an evacuation pump 331 connected through a vacuum pipe 332 and a vacuum gage 331. The pressure in the space is thereby reduced to deform the lower stamper 210 into a convex shape and the disk substrate 101 in close contact with the lower stamper 210 is gradually broken away from the peripheral area. This embodiment will be described with reference to the drawings.

Figure 7:
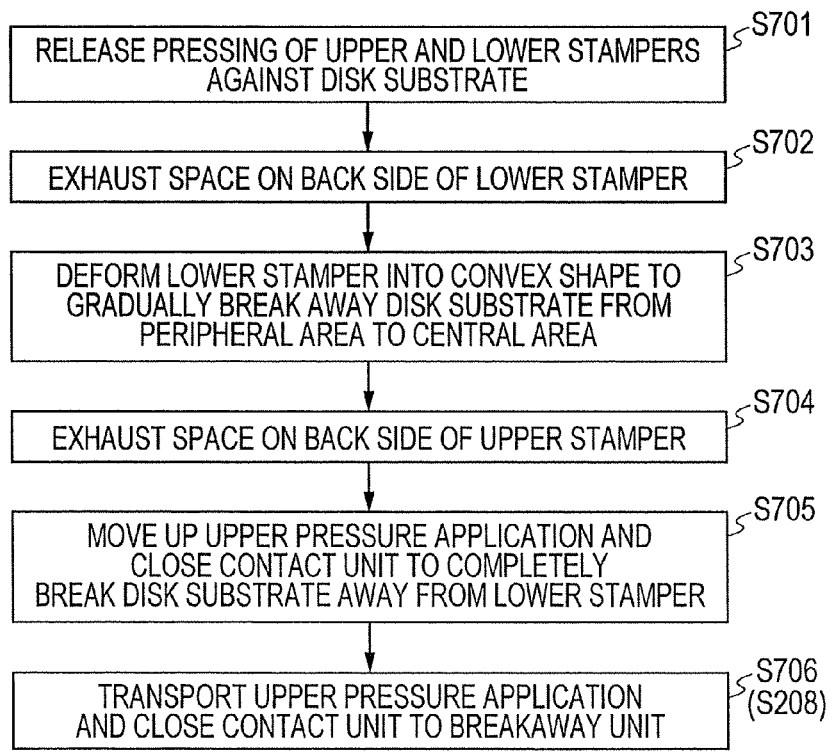
FIG. 7 is a flowchart illustrating the flow of operation of breaking a disk substrate exposed to light away from a lower stamper at a pressure application and exposure unit in a second embodiment.
Figure 8B:
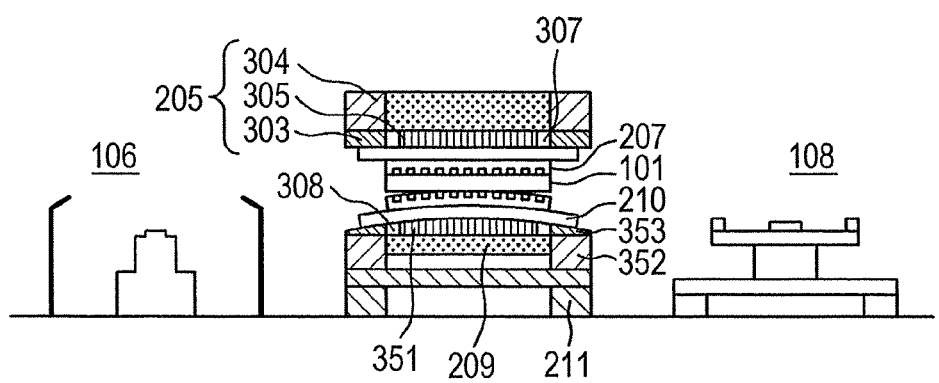
FIG. 8B is a sectional view of the transcription exposure unit of the transcription part illustrating how the back side of the lower stamper is evacuated to deform the lower stamper into a convex shape after exposure in the second embodiment.
Figure 8C:
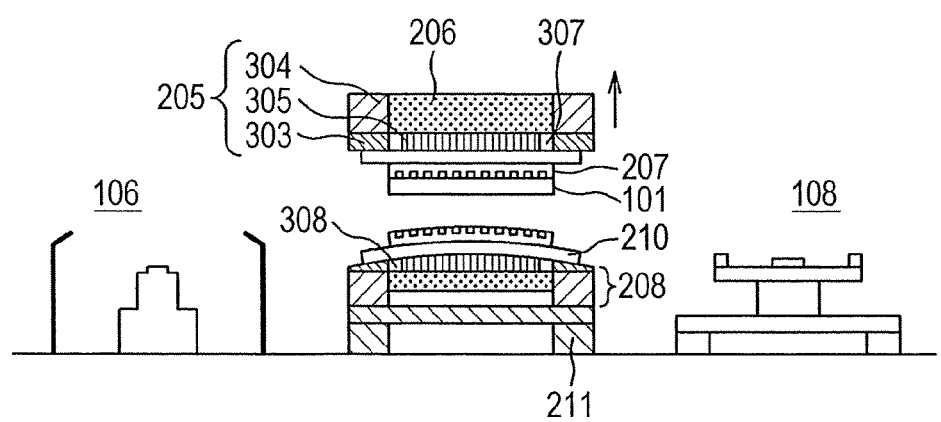
FIG. 8C is a sectional view of the transcription exposure unit of the transcription part illustrating how the back side of the lower stamper is evacuated to deform the lower stamper into a convex shape after exposure and in this state, the upper pressure application and close contact unit is moved up to completely break the lower stamper away from the disk substrate in the second embodiment.

FIG. 7 illustrate a procedure, equivalent to Step S409, for breaking the disk substrate 101 away from the lower stamper 210 after resist is exposed to light. FIGS. 8A to 8C illustrate the relation between the disk substrate 101 and the upper and lower stampers 207 and 210 at this time. The procedure for breaking the disk substrate 101 away from the lower stamper 210 is as follows: as illustrated in FIG. 8A, first, the upper pressure application and close contact unit 205 is slightly moved up by the driving mechanism 310 to release the pressing of the upper and lower stampers 207 and 210 against the entire surfaces of the disk substrate 101 (S701); subsequently, the space 308 on the back side of the lower stamper 210 is evacuated with the exhausting means 330 (S702).

When the space 308 on the back side of the lower stamper 210 is evacuated, the following takes place because of the difference between the reduced pressure and atmospheric pressure: the lower stamper 210 is pressed against the stamper backup elastic body 351 of the lower pressure application and close contact unit 208 and the stamper holding part 353 over a pressure application base 352. Also in the lower pressure application and close contact unit 208, the same measure as in the upper pressure application and close contact unit 205 is taken. That is, the stamper holding part 353 is formed of a material softer (higher in modulus of elasticity) than the material of the stamper backup elastic body 351. Therefore, the stamper holding part 353 is deformed more than the stamper backup elastic body 351 is. As a result, the following takes place in the lower stamper 210: the peripheral area in contact with the stamper holding part 353 is deformed more than the central area in contact with the stamper backup elastic body 351. For this reason, the lower stamper 210 is deformed into a convex shape in which the central area rises as illustrated in FIG. 8B.

The lower stamper 210 is gradually broken away from the disk substrate 101 from the peripheral area by deforming it as mentioned above (S703). Then the space 307 on the back side of the upper stamper 207 is evacuated with the exhausting means to reduce its pressure. The upper stamper 207 is thereby vacuum sucked to the upper pressure application and close contact unit 205 (S704). As illustrated in FIG. 8C, the upper pressure application and close contact unit 205 is moved up to completely break the vacuum sucked upper stamper 207 and the disk substrate 101 in close contact with the upper stamper 207 away from the lower stamper 210 (S705). Then they are transported to the breakaway unit 108 using transport means, not shown (S706: equivalent to S210).

This makes it possible to break the disk substrate 101 with resist exposed to light away from the lower stamper 210.

In FIGS. 8A to 8C, the upper UV exposure unit 214 and the lower UV exposure unit 215 using LEDs 216 described with reference to FIGS. 3A to 3D are omitted. However, this embodiment described with reference to FIGS. 8A to 8C also includes the upper UV exposure unit 214 and the lower UV exposure unit 215 using LEDs 216 like the first embodiment.

Description will be given to a method for breaking the disk substrate 101 in close contact with the upper stamper 207 away from the upper stamper 207 at the breakaway unit 108 in the second embodiment.

Figure 9:
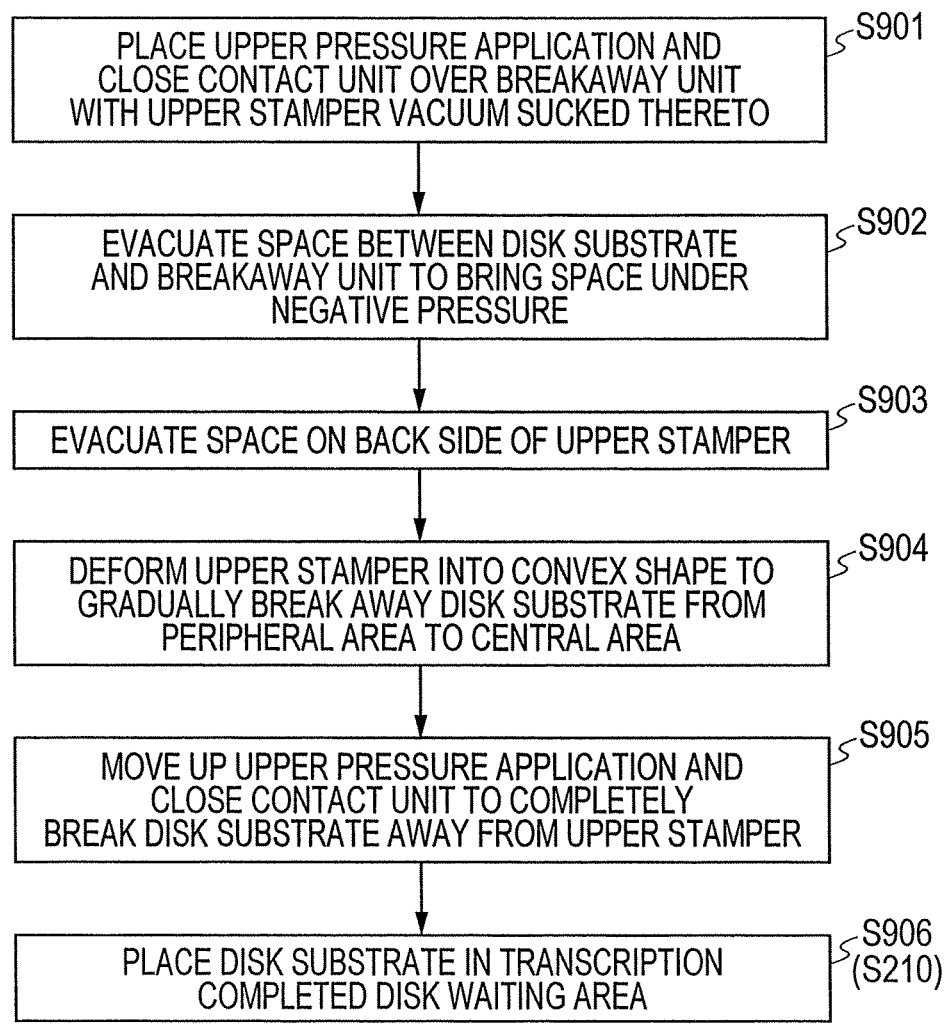
FIG. 9 is a flowchart illustrating the flow of processing of breaking a disk substrate from an upper stamper at a breakaway unit in the second embodiment.
Figure 10A:
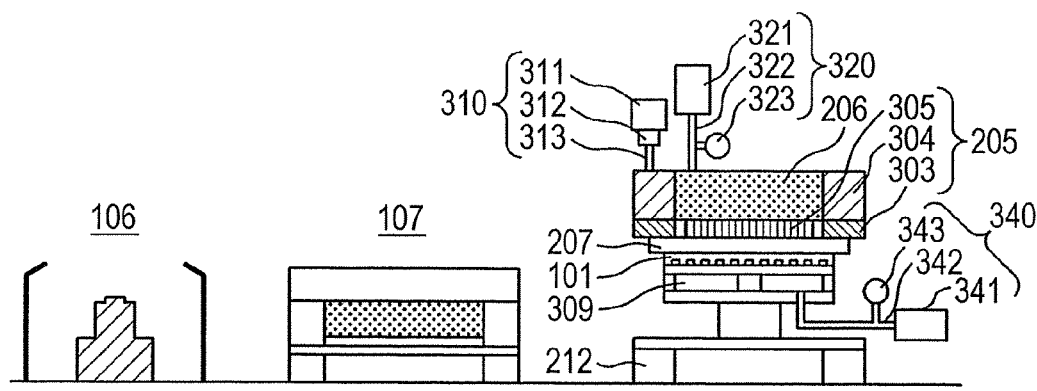
FIG. 10A is a sectional view of the breakaway unit of a transcription part illustrating how an upper pressure application and close contact unit is mounted over a breakaway unit while a disk substrate is in close contact with an upper stamper in the second embodiment.

In this embodiment, the disk fixture 213 for holding the disk substrate 101 described in relation to the first embodiment is not used. Instead, the breakaway unit 108 is provided with evacuating means 340 including an evacuation pump 341 connected through a vacuum pipe 342 and a vacuum gage 343. The space on the back side of the disk substrate 101 is thereby evacuated and brought under negative pressure and the disk substrate is thereby sucked to the breakaway unit 108 and held there. FIG. 9 illustrates the flow of processing in the second embodiment and FIGS. 10A to 10O illustrate the relation between the disk substrate 101, breakaway unit 108, and upper stamper 207 at each process step.

Figure 10B:
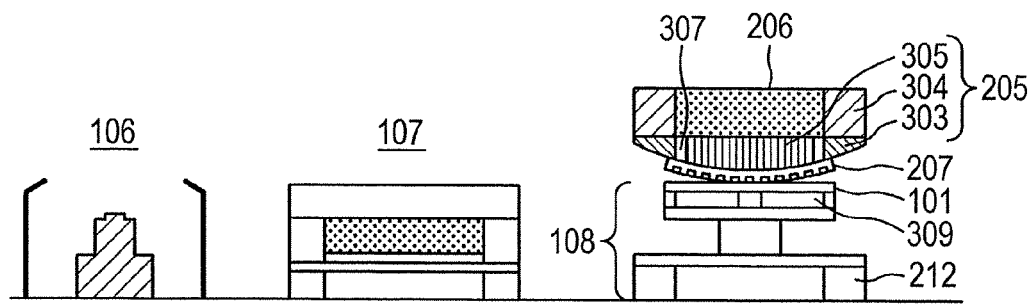
FIG. 10B is a sectional view of the breakaway unit of the transcription part illustrating how the upper stamper is deformed into a convex shape while the disk substrate vacuum is sucked by the breakaway unit in the second embodiment.
Figure 10C:
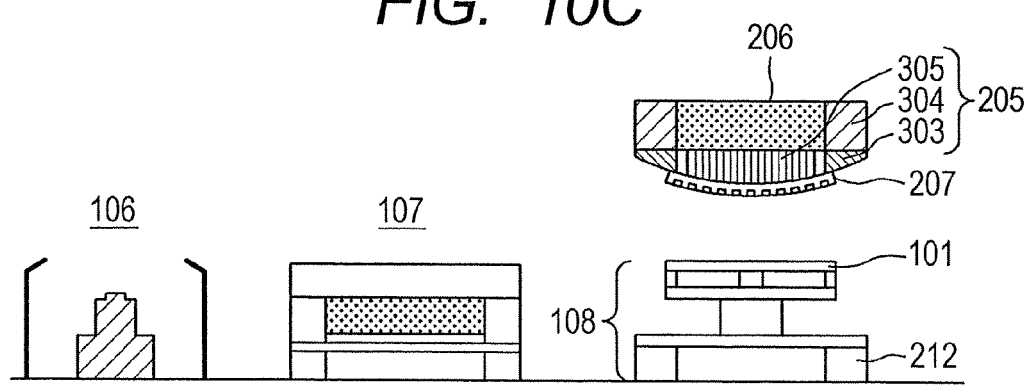
FIG. 10C is a sectional view of the breakaway unit of the transcription part illustrating how the upper pressure application and close contact unit is moved up to completely break the upper stamper away from the disk substrate while the disk substrate vacuum is sucked by the breakaway unit in the second embodiment.

The upper stamper 207 with the disk substrate 101, broken away from the lower stamper 210, in close contact therewith is vacuum sucked to the upper pressure application and close contact unit 205. In this state, the upper stamper is transported to the breakaway unit 108 and placed over the breakaway unit 108 as illustrated in FIG. 10A (S901). Subsequently, the space 309 between the disk substrate 101 and the breakaway unit 108 is evacuated and brought under negative pressure by the evacuating means 340. The disk substrate 101 is thereby sucked to the breakaway unit 108 (S902). In this state, the evacuating means 320 on the side of the upper pressure application and close contact unit 205 is actuated to start evacuation of the space 307 between the upper stamper 207 and the upper pressure application and close contact unit 205 (S903). As illustrated in FIG. 10B, the upper stamper 207 is deformed into a convex shape to gradually break it away from the disk substrate 101 from the peripheral area to the center of the upper stamper 207 (S904). The upper pressure application and close contact unit 205 is moved up by the driving mechanism 310 to completely break the disk substrate 101 away from the upper stamper 207 as illustrated in FIG. 10C (S905). The disk substrate 101 broken away from the upper stamper 207 is placed in the transcription completed disk waiting area 113 by the disk ejection material handler 109 (S906: equivalent to S210).

According to this embodiment, the following can be implemented by evacuating the spaces on the back side of the upper stamper 207 and the lower stamper 210 to bring them under negative pressure: they are deformed into a convex shape and broken away from the disk substrate 101 from the peripheral area to the central area in a short time. This enables throughput enhancement.

As the result of their back spaces being evacuated, each of the upper stamper 207 and the lower stamper 210 is broken away from the disk substrate 101, kept in contact with the stamper holding part 303. This makes it possible to prevent dusting due to repeated contact and separation between the upper stamper 207 and the lower stamper 210 and the stamper holding part 303. Thus it is possible to carry out exposure in a cleaner environment.

The following can be implemented by the methods described up to this point in relation to the first embodiment and the second embodiment: the ingress of air bubbles due to superficial slight undulation is prevented and a disk substrate 101 with uniform concavo-convex patterns transcripted to the surfaces thereof is obtained.

The above-mentioned transcription of a fine pattern formed in a stamper to a disk substrate 101 is simultaneously carried out on both sides of the disk substrate 101. As a result, it is possible to transcript uniform concavo-convex patterns to both sides of the disk substrate 101.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

What is claimed is:

1. An apparatus for transcripting fine patterns, comprising:
   a resist application unit which applies resist to both sides of a substrate;
   an exposure unit which presses two stampers that make a pair with fine patterns formed therein against both sides of the substrate with resist applied to both sides thereof by the resist application unit and exposes the resist applied to both sides of the substrate with light and thereby transcripts the patterns formed in the two stampers to the resist;
   a substrate unloading unit which breaks the substrate away from one of the two stampers pressed against both sides of the substrate with the patterns transcripted to both sides thereof and unloading the substrate from the exposure unit together with the other of the two stampers; and
   a breakaway unit which receives the substrate unloaded from the exposure unit by the substrate unloading unit and breaks the substrate away from the other stamper,
   wherein the exposure unit includes:
   two stamper deforming means that make a pair respectively deforming the two stampers into a convex shape and releasing the convex shape deformation;
   two stamper driving means that make a pair respectively advancing or retreating the two stampers in a direction perpendicular to both sides of the substrate with the resist applied to both sides thereof; and
   two exposure means which expose both sides of the substrate with the resist applied to both sides thereof with UV light emitted from LEDs passed through each of the two stampers pressed against both sides of the substrate by the two stamper driving means,
   wherein each of the two stamper deforming means corresponds to one of the two stampers, and
   wherein at least one of the two stamper deforming means corresponding to one of the two stampers includes:
   an evacuation part which evacuates a space on an opposite side to a surface of the one of the two stampers opposed to the substrate;
   a first elastic member which supports the vicinity of a peripheral area of a surface of the one of the two stampers on the opposite side to the side where the one of the two stampers is opposed to the substrate with the space evacuated by the evacuation part; and
   a second elastic member which supports the vicinity of a central area of the surface of the one of the two stampers on the opposite side to the side where the one of the two stampers is opposed to the substrate with the space evacuated by the evacuation part.

2. The apparatus for transcripting fine patterns according to claim 1, wherein the first elastic member has a higher modulus of elasticity than the second elastic member.

3. The apparatus for transcripting fine patterns according to claim 1, wherein the two stamper driving means advances the two stampers deformed into a convex shape, by the two stamper deforming means, in the direction perpendicular to both sides of the substrate with the resist applied to both sides thereof and pressing the two stampers deformed into a convex shape against both sides of the substrate with the resist applied to both sides thereof.

4. The apparatus for transcripting fine patterns according to claim 1, wherein with the two stampers deformed into a convex shape pressed by a certain amount against both sides of the substrate with the resist applied to both sides thereof by the two stamper driving means, each of the two stamper deforming means releases deformation of the two stampers from the convex shape.

5. The apparatus for transcripting fine patterns according to claim 1, wherein with the two stampers, whose deformation into a convex shape by the two stamper deforming means has been released, pressed against both sides of the substrate by the two stamper driving means, the exposure unit applies UV light to both sides of the substrate using LEDs and exposes the resist on both sides of the substrate to the UV light.

6. The apparatus for transcripting fine patterns according to claim 1, wherein with the pair of stampers, whose deformation into a convex shape by the two stamper deforming means has been released, pressed against both sides of the substrate by the two stamper driving means, the exposure unit applies UV light projected from LEDs to both sides of the substrate through backup glass that supports the second elastic member and the second elastic member and exposes the resist on both sides of the substrate to the UV light.

7. The apparatus for transcripting fine patterns according to claim 1,
   wherein after the two stampers are pressed against both sides of the substrate with the resist applied to both sides thereof and the resist is exposed to light and cured at the exposure means,
   at the exposure unit, one of the two stampers is deformed into a convex shape by one of the two stamper deforming means to break away the one of the two stampers starting with the peripheral area of the substrate and the one of the two stampers is thereby broken away from one side of the substrate; and
   at the breakaway unit, the other of the two stampers is deformed into a convex shape by the other of the two stamper deforming means to break away the other of the two stampers starting with the peripheral area of the substrate and the other of the two stampers is thereby broken away from the other side of the substrate.

8. The apparatus for transcripting fine patterns according to claim 7, wherein each of the two stamper deforming means evacuates the space on the opposite side to the surface of the stamper opposed to the substrate by an evacuation part and thereby deforms each of the two stampers into a convex shape and the two stampers are thereby broken away from both sides of the substrate.

* * * * *